US012628303B2

(12) United States Patent
Saadat et al.

(10) Patent No.: US 12,628,303 B2
(45) Date of Patent: May 12, 2026

(54) HALF-BRIDGE SWITCH ARRANGEMENT

(71) Applicant: SEG Automotive Germany GmbH, Stuttgart (DE)

(72) Inventors: Nima Saadat, Stuttgart (DE); Timm Lohmann, Stuttgart (DE); Kaveh Haghverdi, Stuttgart (DE); Murugaperumal Devaraja, Stuttgart (DE)

(73) Assignee: SEG Automotive Germany GmbH, Stuttgart (DE)

( * ) Notice: Subject to any disclaimer, the term of this patent is extended or adjusted under 35 U.S.C. 154(b) by 277 days.

(21) Appl. No.: 18/588,593

(22) Filed: Feb. 27, 2024

(65) Prior Publication Data

US 2024/0298417 A1 Sep. 5, 2024

(30) Foreign Application Priority Data

Mar. 3, 2023 (DE) .......................... 102023105355.8

(51) Int. Cl.
 H05K 7/20 (2006.01)
 H05K 1/02 (2006.01)
 H05K 7/14 (2006.01)
(52) U.S. Cl.
 CPC ....... H05K 7/14329 (2022.08); H05K 1/0263 (2013.01); H05K 7/20909 (2013.01); H05K 2201/10272 (2013.01)

(58) Field of Classification Search
 CPC .. H05K 7/14329; H05K 1/0263; H05K 7/209; H05K 7/20909; H05K 2201/10272; H05K 7/20927; H05K 7/2089; H01L 23/367; H02M 7/003; H02M 7/219; H02M 7/5387
 See application file for complete search history.

(56) References Cited

U.S. PATENT DOCUMENTS

2013/0016548 A1* 1/2013 Seki ...................... H02M 7/003
                                                    363/131
2014/0062210 A1* 3/2014 Wagoner ................ H05K 7/209
                                                    307/89

(Continued)

FOREIGN PATENT DOCUMENTS

DE        102020206199 A1    11/2021

*Primary Examiner* — Jacob R Crum
(74) *Attorney, Agent, or Firm* — Cozen O'Connor

(57) ABSTRACT
A half-bridge switch arrangement has a high-side switch having a plurality of parallel-connected first semiconductor switching elements, a low-side switch having a plurality of parallel-connected second semiconductor switching elements, a positive busbar, to which a terminal of each of the first semiconductor switching elements of the high-side switch is electrically connected, a negative busbar, to which a terminal of each of the second semiconductor switching elements of the low-side switch is electrically connected, and a heat sink, the heat sink having a recess and two plateau sections which are located in an elevated position relative to the recess, the recess being bounded by the two plateau section, wherein the first semiconductor switching elements and the second semiconductor switching elements are arranged on an upper side of the two plateau sections, wherein the positive busbar and the negative busbar are arranged one above the other within the recess.

14 Claims, 5 Drawing Sheets

(56) References Cited

U.S. PATENT DOCUMENTS

| | | | | |
|---|---|---|---|---|
| 2017/0332522 A1 * | 11/2017 | Ushijima | ............. | H01L 23/473 |
| 2022/0093484 A1 * | 3/2022 | Herrault | ............. | H01L 21/4882 |
| 2023/0247754 A1 * | 8/2023 | Haraguchi | ............ | H05K 3/007 |
| | | | | 174/252 |

* cited by examiner

1

HALF-BRIDGE SWITCH ARRANGEMENT

CROSS-REFERENCE TO RELATED APPLICATIONS

This application claims priority to German Patent Application No. 102023105355.8 filed Mar. 3, 2023, titled "Half-bridge switch arrangement," which is hereby incorporated in its entirety.

TECHNICAL FIELD

The present disclosure relates to a half-bridge switch arrangement.

BACKGROUND

Half-bridge switch arrangements can be used in power converters, for example, as inverters for alternating conversion between DC and AC voltages. For example, such half-bridge switch arrangements can be used in power modules in (motor) vehicles to convert a voltage between a DC on-board power supply and an electrical machine that can be operated with multi-phase AC voltage.

Such half-bridge switch arrangements usually have one half-bridge per phase with one high-side switch and one low-side switch. Individual, discrete semiconductor switching elements can be used as high-side or low-side switches, for example individual transistors such as FETs, MOSFETs, IGBTs, etc., or a parallel circuit consisting of a large number of such discrete semiconductor switching elements.

This type of parallel connection of discrete components as high-side switches or low-side switches enables high power scalability and high power or current levels to be achieved. However, this often results in a high DC link inductance and therefore a high total inductance of the commutation loop. It can also often prove difficult to cool such half-bridge switch arrangements sufficiently in order to keep temperatures at desired values at high currents and high switching frequencies.

SUMMARY

Against this background, a half-bridge switch arrangement with the features of claim 1 is proposed. Advantageous embodiments are the subject of the subclaims and the following description.

The half-bridge switch arrangement has a high-side switch comprising a plurality of parallel-connected, discrete first semiconductor switching elements and a low-side switch comprising a plurality of parallel-connected, discrete second semiconductor switching elements. The individual semiconductor switching elements can each be designed, for example, as a transistor, e.g. as FETs, MOSFETs, IGBTs, etc.

Furthermore, the half-bridge switch arrangement has a positive busbar ("B+ busbar"), to which a first terminal of each of the first semiconductor switching elements of the high-side switch, in particular in each case a drain terminal, is electrically connected, and a negative busbar ("B-busbar"), to which a second terminal of each of the second semiconductor switching elements of the low-side switch, in particular in each case a source terminal, is electrically connected. For example, the positive and negative busbars can each be made of or comprise copper.

The half-bridge switch arrangement also has a heat sink, which is suitably provided and set up for cooling the busbars and the semiconductor switching elements. For example, the heat sink can be fluid-cooled and have an inlet and outlet for a corresponding cooling fluid. The cooling fluid can comprise oil, water, air, etc.

The heat sink has a recess or notch or groove and a first and a second plateau section or plateau area that are raised relative to the recess, with the recess being bounded by the first and the second plateau section. In particular, the heat sink is essentially rectangular in shape and has the recess, which is particularly elongated, in a central area. In particular, the recess is also cuboid in shape. The upper side of the recess is in particular parallel to the upper side of the plateau sections. In particular, the recess can extend over an entire dimension in a first direction of the heat sink, e.g. over the entire length or the entire width of the heat sink, so that a plateau section adjoins each of the two opposite side surfaces of the recess. The heat sink is designed or formed in a stepped shape, with the first plateau section forming a first step, with the recess adjoining the first plateau section forming a second step that is lower than the first step, and with the second plateau section adjoining the recess forming a third step that is higher than the second step, in particular just as high as the first step.

The first semiconductor switching elements and the second semiconductor switching elements are arranged on an upper side of the respective first and second plateau sections, so that an outer surface of the individual semiconductor switching elements is expediently in thermal contact with the upper side of one of the plateau sections. In particular, the individual semiconductor switching elements are arranged on the respective plateau section in each case adjacent to the recess. For example, the first semiconductor switching elements can be arranged on the upper side of the first plateau section and the second semiconductor switching elements can be arranged on the upper side of the second plateau section. The respective main extension plane of the individual semiconductor switching elements is oriented in particular parallel to the upper side of the plateau sections. By arranging the semiconductor switching elements on the heat sink, the heat generated by the switching elements can be transferred directly to the heat sink and dissipated from it.

The positive busbar and the negative busbar are arranged one above the other within the recess. In particular, the respective shape and size of the positive and negative busbars can be adapted to the shape of the recess. Conveniently, the positive busbar and the negative busbar are each plate-shaped with a main extension plane and are arranged with their main extension planes parallel to each other and also, in particular, parallel to the upper side of the plateau sections and to the upper side of the recess. By arranging the busbars within the recess, heat can be effectively transferred from the busbars to the heat sink and dissipated from it.

The disclosure provides a half-bridge switch arrangement with a low intermediate circuit inductance and a low thermal impedance, which can be cooled effectively.

By connecting discrete switching elements in parallel as high-side or low-side switches, a high scalability of the power can be achieved in particular. The number of semiconductor switching elements in the respective parallel circuit can be appropriately selected in order to achieve a desired power or a desired current. Furthermore, the overall cost of the circuit can be kept low by using discrete switching elements.

Conventionally, the use of parallel, discrete semiconductor switching elements can often lead to a high parasitic inductance, which can be critical at a high switching speed of WBG elements (wide-bandgap semiconductors, WBG), such as SiC or GaN. Such parasitic inductance can be reduced in the switch arrangement according to the disclosure.

The positive busbar and negative busbar are advantageously arranged close to each other, whereby inductive resistance can be reduced. In particular, a low DC link inductance and a low total inductance of the commutation loop can be achieved. Due to the short distances between the lines or terminals of the switching elements and the busbars, the commutation loop can be improved. The busbars can, for example, be laminated busbars with very low inductance, which enable the half bridge to switch at very high speed.

By arranging the positive and negative busbars on the heat sink, the busbars can be cooled efficiently. In addition, by arranging the semiconductor switching elements on the heat sink, a low thermal impedance can be achieved and the heat released by the switching elements can be effectively dissipated to the heat sink. Although the positive and negative busbars are close to each other to influence the overall inductance of the commutation loop, busbars and switching elements can still be cooled effectively. In particular, the junction temperature of the switching elements can be kept at a desired value at high currents and high switching frequencies.

Instead of using PCB layers to produce the positive and negative busbars, copper plates can be used, for example, which are easy to bend and shape and are cheaper than thick copper conductor plates. Furthermore, the busbars can also be produced by welding onto a piece of metal such as copper, for example. The sizes and dimensions of the busbars can be chosen flexibly and freely and can be adapted to a given installation space, for example.

However, the positive busbar and the negative busbar can also each be formed as layers of a common printed circuit board, e.g. a thick copper circuit board, instead of providing individual, separate busbars. In this way, simple electrical insulation between the individual busbars can be achieved.

According to one embodiment, the respective terminals of the first semiconductor switching elements and the second semiconductor switching elements for connection to the positive busbar and the negative busbar, in particular the respective drain and source terminals, are each bent or kinked into the recess. For example, the terminals can each be designed as pins or wires, which are led out of the respective semiconductor switching element, in particular parallel to its main extension plane, and are then bent or kinked accordingly. In particular, the terminals can be bent or kinked downwards by 90° or at least essentially by 90° starting from the main extension plane of the respective switching element and led into the recess.

According to one embodiment, at least one switching element connection channel is provided in the recess in order to guide or pass the respective terminals of the first semiconductor switching elements and the second semiconductor switching elements for electrical connection to the respective busbar, in particular without contacting the other busbar(s). These switching element connection channels are conveniently provided in the arrangement of the individual busbars within the recess. The individual busbars, which are in particular plate-shaped, can each have corresponding recesses for these switching element connection channels. If the positive and negative busbars are designed as layers of a common printed circuit board, holes can also be provided in the printed circuit board instead of such switching element connection channels, for example.

According to one embodiment, the half-bridge switch arrangement also has a printed circuit board or control board, the printed circuit board being arranged above the first semiconductor switching elements and second semiconductor switching elements, in particular at a predetermined distance above the upper side of the plateau sections of the heat sink. In particular, the printed circuit board is plate-shaped with a main extension plane and is conveniently arranged with the main extension plane parallel to the main extension plane of the positive busbar and the negative busbar and also to the upper side of the plateau sections. The positive busbar and the negative busbar are conveniently electrically connected to the printed circuit board.

According to one embodiment, at least one third terminal of each of the first semiconductor switching elements and at least one third terminal of each of the second semiconductor switching elements is bent or kinked in the direction of the printed circuit board for connection to the printed circuit board. In particular, each semiconductor switching element can have a gate terminal and a Kelvin connection (also referred to as a Kelvin source terminal or auxiliary source terminal) as the at least one third terminal. Such a Kelvin source terminal can decouple the path of a load current from the path of a control current, which can lead to improved switching properties. These third terminals are also designed in particular as pins or wires, which are led out of the respective semiconductor switching element, in particular parallel to its main extension plane, and are then bent or kinked accordingly. Conveniently, these connections are each bent or kinked upwards by 90° or at least substantially by 90° starting from the main extension plane of the respective switching element.

According to one embodiment, at least one elevation is provided on the upper side of each of the first and second plateau sections, on which the printed circuit board is arranged. These one or more elevations can be provided, for example, as platform-like or cuboid sections. In particular, the printed circuit board can rest on these one or more elevations. For this purpose, the height of the individual elevations is expediently greater than the height of the semiconductor switching elements.

According to one embodiment, the half-bridge switch arrangement also has an output-phase busbar, to which a second terminal of each of the first semiconductor switching elements, in particular a source terminal, and a first terminal of each of the second semiconductor switching elements, in particular a drain terminal, are electrically connected. The positive busbar, the negative busbar and the output-phase busbar are arranged one above the other in the recess. In particular, the output-phase busbar is shaped like a plate corresponding to the positive busbar and the negative busbar. Conveniently, the positive busbar, the negative busbar and the output-phase busbar (i.e. their main extension planes) are arranged parallel to each other and parallel to the upper side of the first and second plateau sections and to the upper side of the recess. In particular, the output-phase busbar is arranged on the arrangement of the positive busbar and the negative busbar, i.e. the output-phase busbar is arranged further away from the top of the recess than the positive and negative busbars. Conveniently, heat from the output-phase busbar can be dissipated to the heat sink via the positive and negative busbars and via the side surfaces of the recess.

For example, the positive busbar, the negative busbar and the output-phase busbar can each be formed as layers of a common printed circuit board, e.g. a thick copper circuit board. In this way, simple electrical insulation of the positive busbar, the negative busbar and the output-phase busbar against each other can be achieved.

According to one embodiment, the half-bridge switch arrangement further comprises at least one electrical output-phase insulating layer, wherein the output-phase busbar is electrically insulated by the at least one electrical output-phase insulating layer. These output-phase insulating layer(s) can also be formed in the shape of a plate with a main extension plane and arranged with the main extension plane parallel to the output-phase busbar. For example, a first electrical output-phase insulating layer can be arranged on an underside of the output-phase busbar and a second electrical output-phase insulating layer can be arranged on an upper side of the output-phase busbar. Conveniently, the output-phase busbar can be electrically insulated from the arrangement of the positive and negative busbar by this first output-phase insulating layer arranged on the underside. For example, further elements can be arranged on the second output-phase insulating layer, whereby the output-phase busbar is electrically insulated from these further elements by this second insulating layer. The output-phase insulating layer(s) can be, for example, a heat conducting pad.

According to embodiments of the disclosure, the at least one electrical output-phase insulating layer is part of a printed circuit board. In particular, the output-phase busbar may be formed or buried in the printed circuit board and insulated or covered at the top and bottom by the printed circuit board. As disclosed above, also the positive and/or negative busbars may be part of or buried in the printed circuit board.

According to one embodiment, the half-bridge switch arrangement also has a capacitor unit or capacitor bank, which in turn has at least one discrete capacitor element, in particular a plurality of discrete capacitor elements connected in parallel. The capacitor unit is arranged on the busbars, which in turn are arranged one above the other in the recess, in particular on the arrangement comprising the positive busbar, the negative busbar and the output-phase busbar. The capacitor unit or its capacitor elements are in particular DC link capacitors. The design and shape of the busbars can be used to provide sufficient space for these DC link capacitors, which can reduce the inductance of the commutation loop. By placing the DC link capacitors as close as possible to the switching elements, inductance in particular can be reduced. Due to the short distances between the lines of the switching elements, the busbars and the capacitor unit, the commutation loop can be improved. The positioning of the capacitor unit and its connection to the busbars is easy to implement during the manufacturing process. In particular, the distance between the DC link capacitors and the switching elements can be as symmetrical as possible. For example, the capacitor unit can be cuboid in shape and have a special cuboid capacitor element or a large number of discrete capacitor elements arranged in a cuboid housing.

According to one embodiment, a first terminal of the capacitor unit is electrically connected to the positive busbar, and a second terminal of the capacitor unit is electrically connected to the negative busbar. A capacitor connection channel is provided to guide or pass the respective terminal of the capacitor unit for electrical connection to the respective busbar, in particular without contacting the other busbar(s). This capacitor connection channel is provided in particular in the arrangement consisting of the positive busbar, the negative busbar and the output-phase busbar. Conveniently, the capacitor connection channel can be provided through holes or bores in the busbars and insulating layers arranged further up. Since the capacitor unit cannot easily be connected directly to the lower busbars due to the parallel arrangement of the positive and negative busbars and also the output-phase busbar within the recess, the capacitor connection channel is provided in the upper busbars and insulating layers, through which the corresponding terminal of the capacitor unit can nevertheless be contacted with the respective lower busbar in a structurally simple manner.

According to one embodiment, the printed circuit board has a recess through which the capacitor unit protrudes. In particular, the printed circuit board can extend at least from a first elevation on the first plateau section, which adjoins a first side surface of the recess, to a second elevation on the second plateau section, which adjoins a second side surface of the recess, and thus also partially extend above the recess. The recess for the capacitor unit can usefully be provided in this section of the printed circuit board arranged above the recess.

According to one embodiment, the half-bridge switch arrangement has an electrical busbar insulating layer, wherein the positive busbar and the negative busbar are electrically insulated from each other by the electrical busbar insulating layer. In particular, the busbar insulating layer has a plate-shaped design corresponding to the positive and negative busbars and is arranged between these busbars.

According to one embodiment, the half-bridge switch arrangement has at least one electrical heat sink insulating layer, wherein the positive busbar and the negative busbar are electrically insulated from the heat sink by the at least one electrical heat sink insulating layer. This heat sink insulating layer(s) can in particular be plate-shaped with a main extension plane and arranged in the recess. For example, a first electrical heat sink insulating layer can be arranged directly on the upper side of the recess or between this upper side and the arrangement of the positive busbar and the negative busbar. Conveniently, this first electrical heat sink insulating layer is arranged parallel to that of the positive busbar and the negative busbar and also parallel to the upper side of the recess. Furthermore, a further electrical heat sink insulating layer can be arranged on each side surface of the recess, each of which is conveniently oriented perpendicular to the main extension plane of the positive busbar and the negative busbar.

According to one embodiment, the half-bridge switch arrangement has at least one first electrical switching element insulating layer and at least one second electrical switching element insulating layer, wherein the first semiconductor switching elements are electrically insulated from the heat sink by the at least one first electrical switching element insulating layer, and wherein the second semiconductor switching elements are electrically insulated from the heat sink by the at least one second electrical switching element insulating layer. For example, a separate electrical insulating layer can be provided for each switching element or a common electrical insulating layer can also be provided for several switching elements. In particular, the electrical switching element insulating layers represent a thermal interface material (TIM) between the switching elements and the heat sink and can usefully each have a low thermal resistance or a high thermal conductivity. For example, the switching element insulating layers can each be designed as a ceramic layer with very low thermal resistance. These switching element insulating layers allow heat to be effectively transferred from the semiconductor switching elements to the heat sink and dissipated from it. When switching elements are arranged directly on a printed circuit board in the conventional manner, the thermal resistance of the printed circuit board and the thermal interface material is often not particularly low, so that the switching elements often cannot be easily kept below a desired temperature. In contrast, in the present switch arrangement, the junction temperature of the switching elements can be kept at a desired value even at high current and high switching frequencies.

The half-bridge switch arrangement or half-bridge power stage can be used in particular in a power converter or power converter circuit, for example in an inverter or inverter for alternating conversion between direct and alternating voltages. The half-bridge switch arrangement is particularly suitable for use in a vehicle, for example to convert a voltage between a DC on-board power supply and an electrical machine that can be operated with a multi-phase AC voltage. By connecting the semiconductor switching elements in parallel as high-side or low-side switches, the desired power or current levels can be achieved, particularly in high-power converters in the vehicle sector.

Further advantages and embodiments of the disclosure are shown in the description and the accompanying drawing.

The disclosure is illustrated schematically in the drawing by means of embodiment examples and is described below with reference to the drawing.

DETAILED DESCRIPTION

Figure 1:
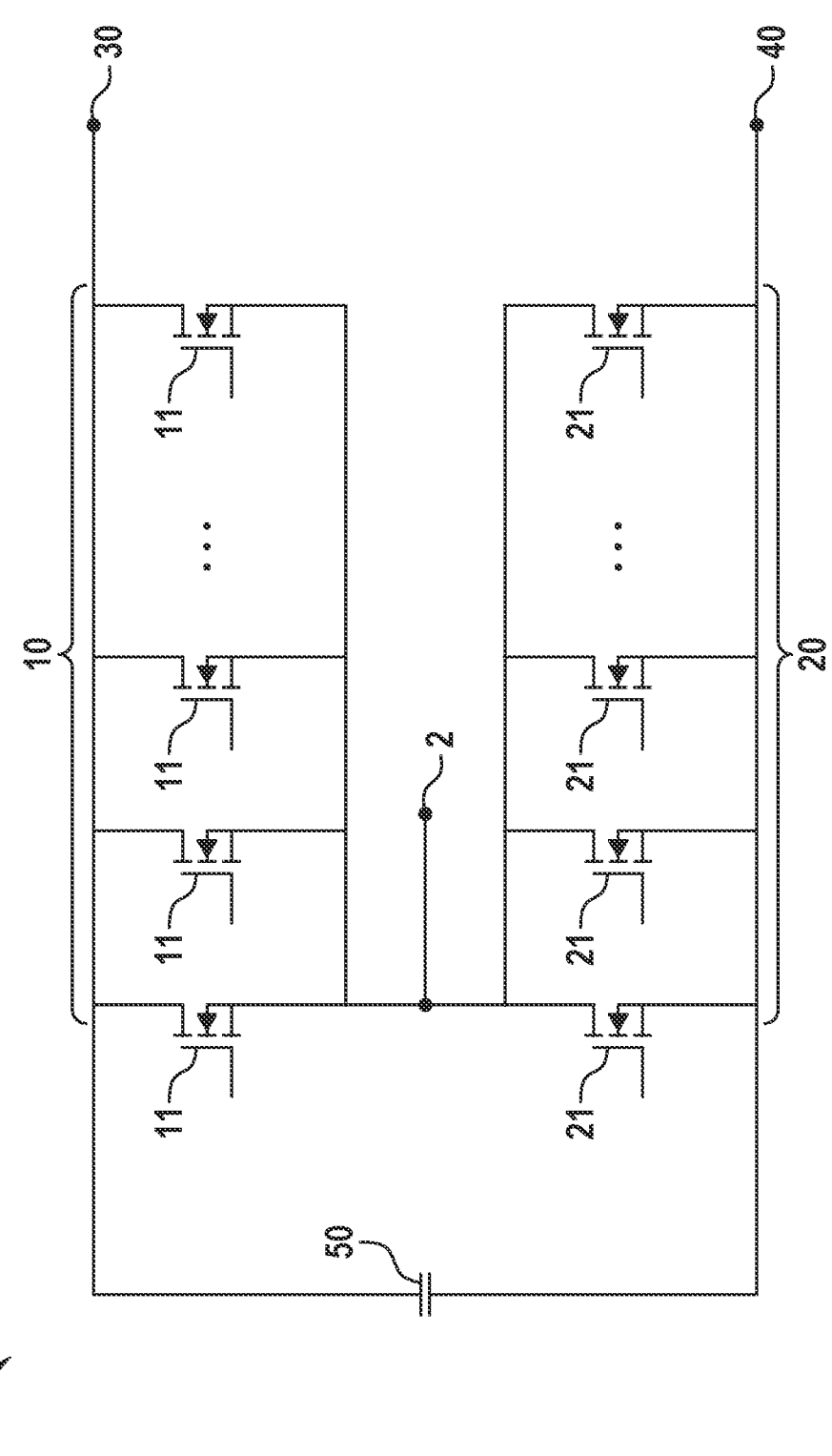
FIG. 1 schematically shows an electrical circuit diagram of a half-bridge switch arrangement, in embodiments.

FIG. 1 schematically illustrates one embodiment of a half-bridge switch arrangement according to the disclosure as an electrical circuit diagram that is labeled 1.

The half-bridge switch arrangement 1 is provided for rectifying or alternating current between DC voltage terminals 30, 40 and an AC voltage terminal 2, and has a high-side switch 10 and a low-side switch 20. The high-side switch 10 has a plurality of discrete first semiconductor switching elements 11 connected in parallel, e.g. each in the form of a metal-oxide-semiconductor field-effect transistor (MOS-FET) or an insulated-gate bipolar transistor (IGBT). Accordingly, the low-side switch 20 also has a plurality of parallel-connected, discrete second semiconductor switching elements 21, each of which can be designed, for example, as a MOSFET or IGBT. The number of semiconductor switching elements 11 or 21 can be selected in each case in order to achieve a desired power or a desired current.

The first semiconductor switching elements 11 of the high-side switch 10 are electrically connected to a positive busbar at their drain terminal (first terminal) and the second semiconductor switching elements 21 of the low-side switch 20 are electrically connected to a negative busbar at their source terminal (second terminal). Furthermore, an intermediate circuit capacitor 50 is provided, which is electrically connected to the positive busbar and to the negative busbar.

For example, the arrangement 1 can be used in a vehicle, wherein the DC voltage connections 30, 40 can be connected, for example, to a DC on-board power supply and wherein a phase of an electrical machine can be connected to the AC voltage connection 2, for example.

The electrical machine can be a multi-phase machine, e.g. with typically three or more phases. In particular, a half-bridge with high-side and low-side switches is provided for each of the phases, as shown in FIG. 1. Furthermore, in particular a control unit for controlling the individual switching elements 11, 21 can be provided, wherein the control unit can control the gate terminals of the switching elements 11, 21 in such a way that a direct or alternating current flows.

Figure 2A:
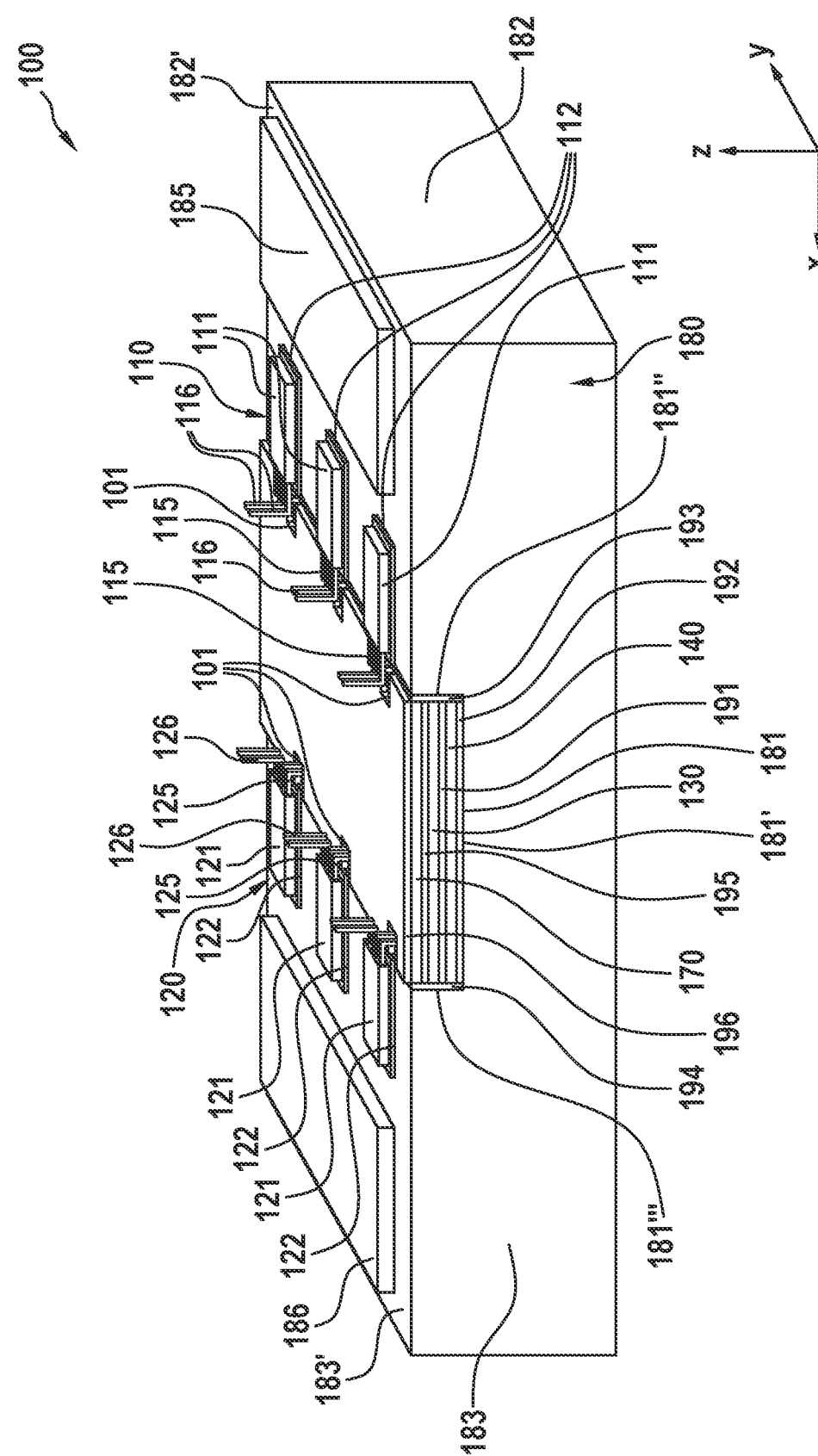
FIGS. 2a-2d schematically show various perspective views of a half-bridge switch arrangement, in embodiments.

FIG. 2a shows a schematic perspective view of one embodiment of a half-bridge switch arrangement according to the disclosure that is labeled 100.

In accordance with the electrical circuit diagram shown in FIG. 1, the half-bridge switch arrangement 100 has a high-side switch 110 and a low-side switch 120, wherein the high-side switch 110 has a plurality of parallel-connected, discrete first semiconductor switching elements 111 and wherein the low-side switch 120 has a plurality of parallel-connected, discrete second semiconductor switching elements 121. The semiconductor switching elements 111 and 121 are each designed, for example, as a MOSFET or IGBT. In FIG. 2a, three first or second semiconductor switching elements 111 or 121 are provided as examples, but the number of semiconductor switching elements can also be larger or smaller, in particular depending on the desired power or desired current that is to flow through the semiconductor switching elements in total.

A positive busbar 130 is provided, to which the drain terminals (first terminal) of the first semiconductor switching elements 111 of the high-side switch 110 are electrically connected. A negative busbar 140 is provided, to which the source terminals (second terminal) of the second semiconductor switching elements 121 of the low-side switch 120 are electrically connected.

A heat sink 180 is provided to cool the busbars 130, 140 and the semiconductor switching elements 111, 121. The heat sink 180 can be fluid-cooled and have fluid connections for a cooling fluid. The fluid can be, for example, oil, cooling water, but also cooling air, i.e. air can also flow through it, for example.

The heat sink 180 has a recess or notch or groove 181 and two plateau sections 182, 183 which are elevated relative to the recess 181 and which delimit or bound the recess 181. As shown in FIG. 2a, the heat sink 180 can be essentially cuboidal in shape and have the likewise cuboidal recess 181 in a central region, which can extend over the entire dimension of the heat sink 180 viewed in the y-direction. A first plateau section 182 adjoins (in the x-direction or transversely to the course of the recess) a first side surface 181″ of the recess 181, and a second plateau section 183 adjoins (in the x-direction or transversely to the course of the recess) a second side surface 181‴ of the recess 181 opposite the first side surface 181″.

The first semiconductor switching elements 111 and the second semiconductor switching elements 121 are arranged on an upper surface 182′, 183′ of the plateau sections 182, 183, wherein an outer surface of each of the individual switching elements 111, 121 is in thermal contact with the respective plateau section 182, 183. For example, the first semiconductor switching elements 111 can be arranged on the upper side 182′ of the first plateau section 182 and the second semiconductor switching elements 121 can be arranged on the upper side 183′ of the second plateau section 183, in each case in particular adjacent to the recess 181.

The positive busbar 130 and the negative busbar 140 are arranged one above the other within the recess 181. For example, these two busbars 130 and 140 are plate-shaped with a main extension plane and are oriented with the main extension plane parallel to each other and parallel to the upper side 182', 183' of the plateau sections 182, 183 and to the upper side 181' of the recess 181. A respective dimension of the rails 130, 140 in the y-direction corresponds at least substantially to the corresponding dimension in the y-direction of the recess 181. A respective dimension of the rails 130, 140 in the x-direction corresponds at least substantially to the dimension of the recess 181 in the x-direction. The positive and negative busbars 130, 140 are electrically insulated from each other by an electrical busbar insulating layer 191, which is also plate-shaped with a main extension plane and is arranged between the two busbars 130, 140 with the main extension plane parallel thereto.

The half-bridge switch arrangement 100 further comprises an output-phase busbar 170. The source terminals (second terminal) of the first semiconductor switching elements 111 and the drain terminals (first terminal) of the second semiconductor switching elements 121 are electrically connected to the output-phase busbar 170. The output-phase busbar 170 is arranged in the recess 181 on the arrangement of positive busbar 130 and the negative busbar 140. The output-phase busbar 170 is also plate-shaped with a main extension plane and is oriented with the main extension plane parallel to the main extension plane of the positive and negative busbars 130, 140. A first electrical output-phase insulating layer 195 is provided below the output-phase busbar 170, and a second electrical output-phase insulating layer 196 is provided above the output-phase busbar 170 to electrically insulate the output-phase busbar 170. The shown arrangement of output-phase busbar 170, first electrical output-phase insulating layer 195 and second electrical output-phase insulating layer 196 may be in the form of a printed circuit board (PCB).

Electrical heat sink insulating layers 192, 193, 194 are provided to electrically insulate the assembly of the positive busbar 130, the negative busbar 140 and the output-phase busbar 170 from the heat sink 180, wherein a first electrical heat sink insulating layer 192 is disposed between the top surface 181' of the recess 181 and the negative busbar 140, wherein a second electrical heat sink insulating layer 193 is disposed on the first side surface 181'' of the recess 181, and wherein a third electrical heat sink insulating layer 194 is disposed on the second side surface 181''' of the recess 181.

At least one first electrical switching element insulating layer 112 is provided, by means of which the first semiconductor switching elements 111 are electrically insulated from the heat sink 180. Correspondingly, at least one second electrical switching element insulating layer 122 is provided, by means of which the second semiconductor switching elements 121 are electrically insulated from the heat sink 180. As shown in FIG. 2a, a separate electrical insulating layer 112 or 122 can be provided for each switching element 111 or 121.

Individual, some or all of the busbar insulating layer 191, the heat sink insulating layers 192, 193, 194, the output-phase insulating layers 195, 196 and the switching element insulating layers 112, 122 may each have a low thermal resistance or a high thermal conductivity. For example, the thermal conductivity of the insulating layers can each be more than 1, 10 or 100 W/(m·K). In this way, waste heat from the individual semiconductor switching elements 111, 121 and the busbars 130, 140 or 170 can be effectively transferred to the heat sink 180 and dissipated from it.

First and second terminals 115 of the first semiconductor switching elements 111 and first and second terminals 125 of the second semiconductor switching elements 121, in particular the drain and source terminals of these switching elements 111, 121, are each bent or kinked into the recess

181 for connection to the positive busbar 130, the negative busbar 140 or the output-phase busbar 170. These individual connections 115, 125 are each formed, for example, as pins or wires, which are led out of the respective semiconductor switching element parallel to its main extension plane in the x-direction and are then bent or kinked at least substantially 90° downwards in the z-direction.

In the recess 181 or in the arrangement comprising the positive busbar 130, the negative busbar 140 and the output-phase busbar 170, switching element connection channels 101 are provided, through which the respective terminals 115, 125 of the semiconductor switching elements 111, 121 are guided or passed for electrical connection to the respective busbar without contacting the other busbars. The busbars 130, 140 and 170 as well as the busbar insulating layer 191 and the first and second output-phase insulating layers 195, 196 can each have recesses for these switching element connection channels 101.

At least one third terminal 116 of each of the first semiconductor switching elements 111 and at least one third terminal 126 of each of the second semiconductor switching elements 121 is bent or kinked upwards in the opposite direction to the first and second terminals 115 and 125, respectively, for connection to a printed circuit board. For example, each of the first and second semiconductor switching elements 111, 121 may have a gate terminal and a Kelvin source terminal as third terminals 116, 126, respectively. These third terminals 116, 126 are also each formed as pins or wires, which are led out of the respective semiconductor switching element 111, 121 parallel to the main extension plane and are then bent or kinked upwards by at least substantially 90° in the z-direction.

Such a printed circuit board can be arranged above the semiconductor switching elements 111, 121 at a predetermined distance in the z-direction from the upper side 182', 183' of the first and second plateau sections 182, 183. A first elevation 185 is provided on the upper side 182' of the first plateau section 182, and a second elevation 186 is provided on the upper side 183' of the second plateau section 183, whereby the printed circuit board can be arranged on these elevations 185, 186. These elevations 185, 186 can each be rectangular in shape. The printed circuit board can be cooled by the elevations 185, 186.

Figure 2B:
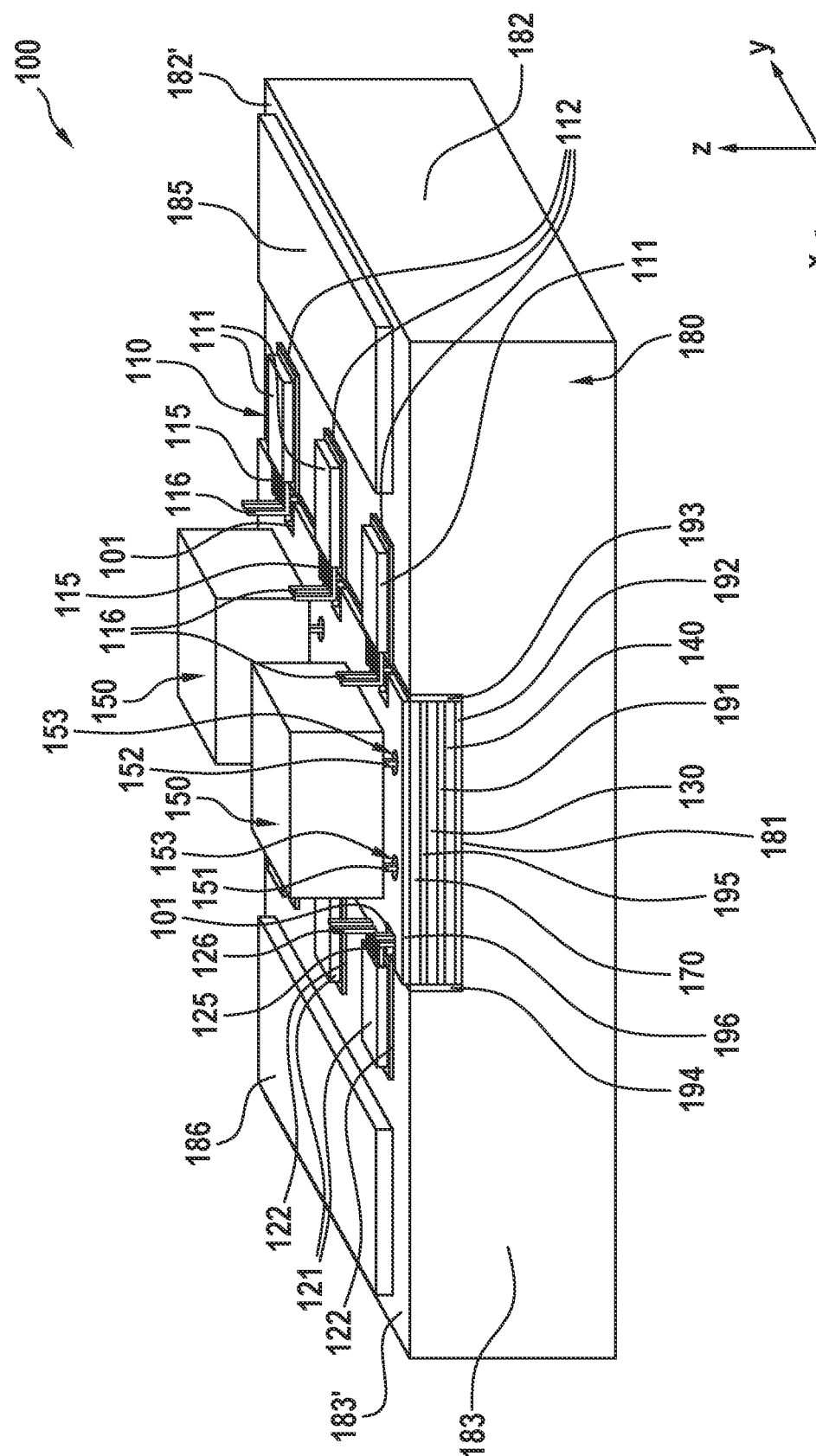

FIG. 2b shows a perspective view of the half-bridge switch arrangement 100 of FIG. 2a. As shown in FIG. 2b, the half-bridge switch arrangement 100 may further comprise one or more capacitor units 150, which may be arranged on the busbars arranged one above the other in the recess 181, for example on the arrangement comprising the positive busbar 130, the negative busbar 140 and the output-phase busbar 170, furthermore for example on the second output-phase insulating layer 196.

In the example of FIG. 2b, two such capacitor units 150 are provided. However, it is understood that the half-bridge switch arrangement 100 can also have only one such capacitor unit 150 or more than two capacitor units 150. These capacitor units 150 are each of identical construction, for example, and each have at least one discrete capacitor element, e.g. a plurality of parallel-connected, discrete capacitor elements.

Each capacitor unit 150 has a first terminal 151 that is electrically connected to the positive busbar 130, and a second terminal 152 that is electrically connected to the negative busbar 130. Capacitor connection channels 153 are provided, for example, respectively as holes or bores in the second output-phase insulating layer 196, the output-phase busbar 170, the first output-phase insulating layer 195, the positive busbar 130 and the busbar insulating layer 191 in order to guide or lead the respective first terminal 151 of the capacitor unit 150 to the positive busbar 130 and in order to guide or lead the respective second terminal 152 to the negative busbar 140.

Figure 2C:
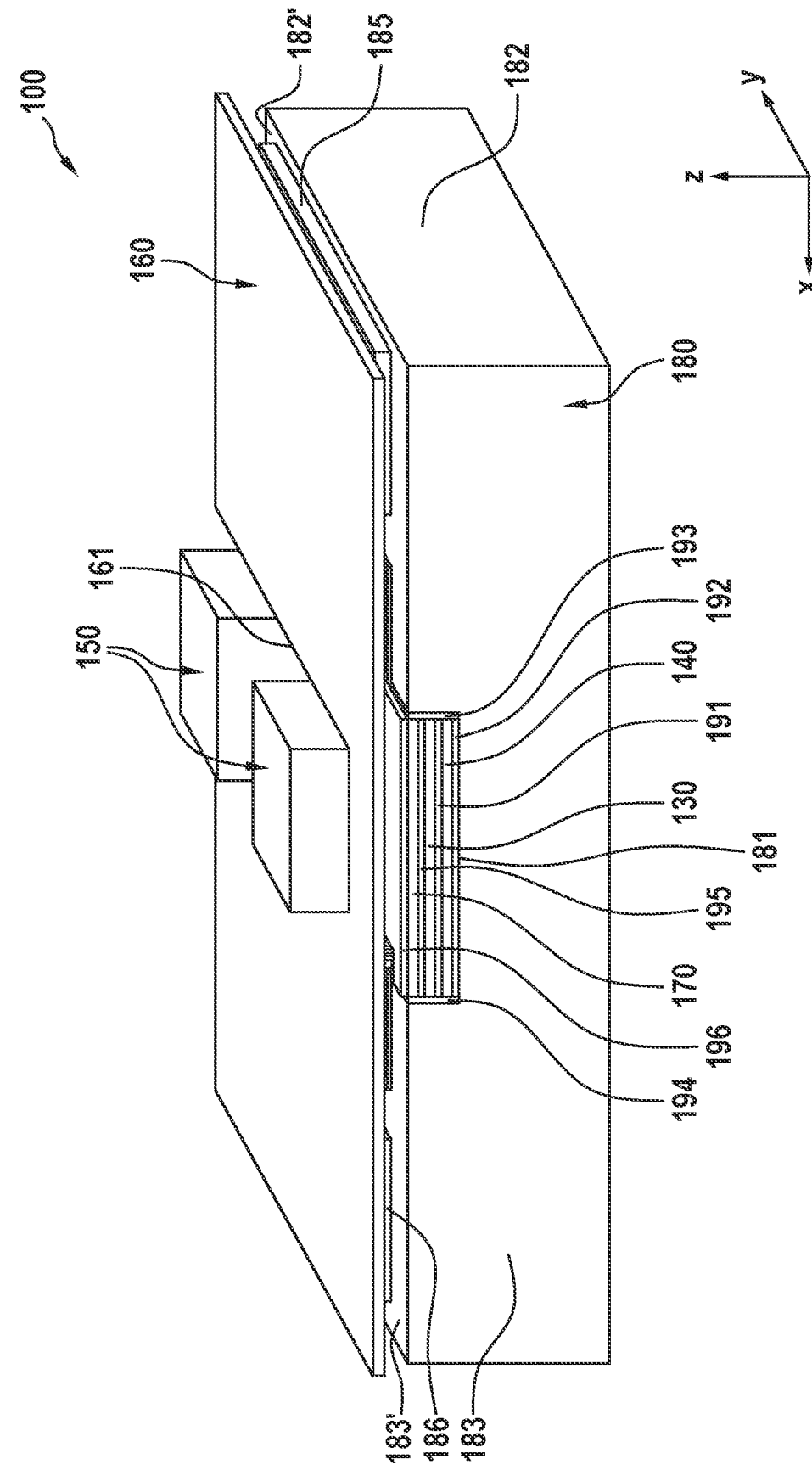

FIG. 2c shows the half-bridge switch arrangement 100 of FIGS. 2a and 2b in a perspective view, further comprising a printed circuit board 160. As explained above, this printed circuit board 160 is arranged on the elevations 185, 186 of the plateau sections 182, 183 and the respective upwardly bent second terminal 116, 126 of the semiconductor switching elements 111, 121 is electrically connected to the printed circuit board 160 in each case. As shown in FIG. 2c, the printed circuit board 160 may further comprise a recess 161 through which the capacitor units 150 protrude.

Figure 2D:
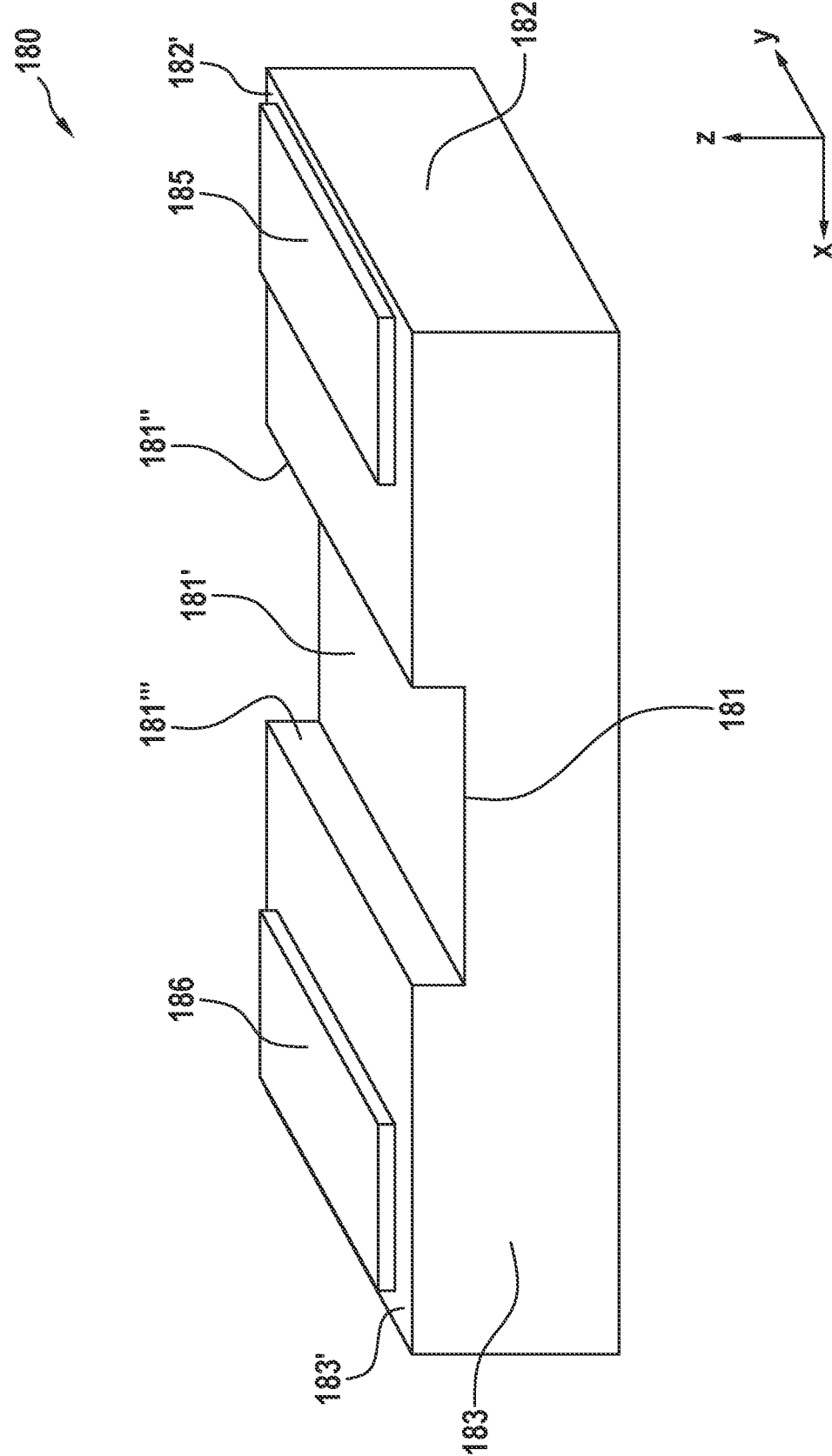

FIG. 2d shows the heat sink 180 in a perspective view. As shown in FIG. 2d, the cuboid recess 181 extends over the entire dimension of the heat sink 180 as viewed in the y-direction. A dimension of the recess 181 as viewed in the z-direction is, in particular, constant in size over its entire upper side 181' oriented parallel to the xy-plane. The heat sink 180 is formed in a stepped shape, wherein the first plateau section 182 forms a first step, wherein the recess 181 forms a second, low step, and wherein the second plateau section 183 forms a third step.

We claim:

1. A half-bridge switch arrangement (1, 100), comprising:
a high-side switch (10, 110) comprising a plurality of parallel-connected first semiconductor switching elements (11, 111),
a low-side switch (20, 120) comprising a plurality of parallel-connected second semiconductor switching elements (21, 121),
a positive busbar (130), to which a first terminal of each of the first semiconductor switching elements (11, 111) of the high-side switch (10, 110) is electrically connected,
a negative busbar (140), to which a second terminal of each of the second semiconductor switching elements (21, 121) of the low-side switch (20, 120) is electrically connected, and
a heat sink (180),
wherein the heat sink (180) has a recess (181), a first plateau section (182) which is elevated relative to the recess (181) and a second plateau section (183) which is elevated relative to the recess (181), wherein the recess (181) is bounded by the first and second plateau sections (182, 183),
wherein the heat sink is formed in a stepped shape, with the first plateau section forming a first step, with the recess adjoining the first plateau section forming a second step that is lower than the first step, and with the second plateau section adjoining the recess forming a third step that is higher than the second step,
wherein the first semiconductor switching elements (11, 111) and the second semiconductor switching elements (21, 121) are arranged on an upper side (182', 183') of the first and second plateau sections (182, 183),
wherein the positive busbar (130) and the negative busbar (140) are arranged one above the other within the recess (181).

2. The half-bridge switch arrangement according to claim 1, wherein the respective terminals (115, 125) of the first semiconductor switching elements (111) and the second semiconductor switching elements (121) are bent or kinked into the recess (181) for connection to the positive busbar (130) and the negative busbar (140), respectively.

3. The half-bridge switch arrangement according to claim 2, wherein at least one switching element connection channel (101) is provided in the recess (181) for guiding the respective terminals (115, 125) of the first semiconductor switching elements (111) and the second semiconductor switching elements (121) for electrical connection to the respective busbar (130, 140).

4. The half-bridge switch arrangement according to claim 1, further comprising a printed circuit board (160), wherein the printed circuit board (160) is arranged above the first semiconductor switching elements (111) and the second semiconductor switching elements (121).

5. The half-bridge switch arrangement according to claim 4, wherein at least one third terminal (116) of each of the first semiconductor switching elements (111) and at least one third terminal (126) of each of the second semiconductor switching elements (121) is bent or kinked in the direction of the printed circuit board (160) for connection to the printed circuit board (160).

6. The half-bridge switch arrangement according to claim 4, wherein on the upper side (182', 183') of each of the first and second plateau sections (182, 183) at least one elevation (185, 186) is provided, on which the printed circuit board (160) is arranged.

7. The half-bridge switch arrangement according to claim 1, further comprising an output-phase busbar (170), to which a second terminal of each of the first semiconductor switching elements (11, 111) and a first terminal of each of the second semiconductor switching elements (21, 121) is electrically connected, wherein the positive busbar (130), the negative busbar (140) and the output-phase busbar (170) are arranged one above the other in the recess (181).

8. The half-bridge switch assembly according to claim 7, further comprising at least one output-phase electrical insulating layer (195, 196), wherein the output-phase busbar (170) is electrically insulated by the at least one output-phase insulating layer (195, 196).

9. The half-bridge switch arrangement according to claim 1, further comprising a capacitor unit (150) comprising at least one capacitor element, wherein the capacitor unit (150) is arranged on the busbars (130, 140, 170) which are arranged one above the other in the recess (181).

10. The half-bridge switch arrangement according to claim 9, wherein a first terminal (151) of the capacitor unit (150) is electrically connected to the positive busbar (130), and wherein a second terminal (152) of the capacitor unit (150) is electrically connected to the negative busbar (140), wherein a capacitor connection channel (153) is provided to guide the respective terminal (151, 152) of the capacitor unit (150) for electrical connection to the respective busbar (130, 140).

11. The half-bridge switch arrangement according to claim 9, further comprising a printed circuit board (160), wherein the printed circuit board (160) is arranged above the first semiconductor switching elements (111) and the second semiconductor switching elements (121), wherein the printed circuit board (160) has a recess (161) through which the capacitor unit (150) projects.

12. The half-bridge switch arrangement according to claim 1, further comprising an electrical busbar insulating layer (191), wherein the positive busbar (130) and the negative busbar (140) are electrically insulated from each other by the busbar insulating layer (191).

13. The half-bridge switch arrangement according to claim 1, further comprising at least one electrical heat sink insulating layer (192, 193, 194), wherein the positive busbar (130) and the negative busbar (140), further in particular the output-phase busbar, are electrically insulated from the heat sink (180) by the at least one electrical heat sink insulating layer (192, 193, 194).

14. The half-bridge switch arrangement according to claim 1, further comprising at least one first electrical switching element insulating layer (112) and at least one second electrical switching element insulating layer (122), wherein the first semiconductor switching elements (111) are electrically insulated from the heat sink (180) by the at least one first electrical switching element insulating layer (112), and wherein the second semiconductor switching elements (121) are electrically insulated from the heat sink (180) by the at least one second electrical switching element insulating layer (122).

* * * * *